United States Patent
Kase

Patent Number: 5,130,635
Date of Patent: Jul. 14, 1992

[54] VOLTAGE REGULATOR HAVING BIAS CURRENT CONTROL CIRCUIT

[75] Inventor: Kiyoshi Kase, Tokyo, Japan

[73] Assignee: Nippon Motorola Ltd., Tokyo, Japan

[21] Appl. No.: 747,072

[22] Filed: Aug. 19, 1991

[30] Foreign Application Priority Data

Sep. 18, 1990 [JP] Japan ............... 2-246253

[51] Int. Cl.⁵ .............. G05F 1/40; H03K 3/01
[52] U.S. Cl. ............ 323/280; 307/296.6; 307/296.8
[58] Field of Search ......... 307/493, 296.1, 296.6, 307/296.8, 494, 264; 323/280, 273, 274, 275

[56] References Cited

U.S. PATENT DOCUMENTS

| | | | |
|---|---|---|---|
| 4,251,743 | 2/1981 | Hareyama | 307/296.6 |
| 4,393,346 | 7/1983 | Jones | 323/280 |
| 4,933,625 | 6/1990 | Hayakawa | 323/280 |
| 4,952,863 | 8/1990 | Sartwell et al. | 323/280 |
| 4,983,905 | 1/1991 | Sano et al. | 323/274 |
| 5,061,863 | 10/1991 | Mori et al. | 307/350 |
| 5,087,891 | 2/1992 | Cytera | 307/296.8 |

Primary Examiner—Stanley D. Miller
Assistant Examiner—Toan Tran
Attorney, Agent, or Firm—Charles R. Lewis

[57] ABSTRACT

This invention relates to a bias current control circuit which drives a power MOS transistor. Since the power MOS transistor has a large capacitance which is formed between a gate and a channel, it is needed to provide a circuit which is able to sufficiently supply a drive current to the gate. Such a circuit increases a consumption current because the circuit has to always flow the current to drive the gate. This invention provides a circuit which cut the consumption current in the circuit when the transistor is not driven, and increases a consumption current in the circuit in order to keep a gate current when the transistor is driven.

2 Claims, 2 Drawing Sheets

VOLTAGE REGULATOR HAVING BIAS CURRENT CONTROL CIRCUIT

FIELD OF THE INVENTION

This invention refers to a bias current control circuit which controls an operation of MOS transistor, and more particularly, to an adaptive bias current control circuit which controls a current which provides to a gate of power MOS transistor depending on the output current.

BACKGROUND OF THE INVENTION

Power transistor, thyrister, rectifier diode etc. have been used as a semiconductor for a power device since before. For example, when a bipolar power transistor is used as a power control device, the state of operation is controlled in response to a current which is provided to the base. Plenty of base current is needed to operate the power transistor in a saturate region. In general more sufficient current than a value which is divided by a current amplification factor of the transistor is provided as a base current. Therefore a circuit for providing a sufficient base current is needed to control a bipolar power transistor.

In structural feature, MOS transistor is controlled in response to a voltage supplied to the gate. Therefore a steady-state current for the gate is not needed and a circuit for providing the sufficient current like a bipolar power transistor is not also needed.

As mentioned above, no gate current at steady-state is needed to keep the state of the operation because MOS power transistor is a device controlled by voltage supplied to the gate. However a transient current flows into the gate electrode when the state of operation is changed. This gate current is caused by a capacitance between gate an channel. The current flows as a charge current when high voltage is given to the gate electrode and as a discharge current when low voltage is given to the gate electrode.

More sufficient gate current is required for bigger power transistor because large channel is required to flow sufficient current between drain and source so that a capacitance between gate and channel increases.

Therefore large current is transiently required to charge sufficiently the capacitance between gate and channel, and turn on the transistor. If sufficient current is not provided, switching speed is delayed.

When a bias circuit for always supplying sufficient gate current is provided to prevent from a delay of a switching speed of transistor, it has a trouble that a consumption power in the bias circuit increases.

SUMMARY OF THE INVENTION

Accordingly, it is an object of the present invention to provide a bias current control circuit by which the switching speed of MOS power transistor is not delayed.

It is a further object of the present invention to a bias current control circuit to prevent from increasing a consumption power.

In accordance with the above and other objects there is provided a bias current control circuit comprising a MOS transistor having a gate, a source and a drain; a detection circuit in response to an output of said MOS transistor for providing a detection voltage; a reference voltage source for generating a predetermined reference voltage; an amplifier having a first input, a second input and a third input, said first input coupled to an output of said reference voltage source, said second input coupled to an output of said detection circuit and an output of said amplifier coupled to said gate of said MOS transistor, wherein said amplifier provides a voltage responsive to a difference voltage applied between said first input and said second input, and in response to a control signal given to said third input, said amplifier controls a current which flows to said gate; a control signal generating circuit for supplying to said third input said control signal responsive to a difference between said reference voltage and a voltage provided at said output of said detection circuit.

The MOS transistor is controlled in response to a voltage applied to the gate from the amplifier. The output of the MOS transistor is connected to the detection circuit so that the detection voltage in response to the output is derived. The reference voltage source generates a predetermined reference voltage, the voltage is provided to the amplifying circuit and the control signal generating circuit. The amplifier applies the gate of the MOS transistor the voltage corresponding to the difference between the reference voltage and the detection voltage. The control signal generating circuit derives the control signal determined in response to the difference between the reference voltage and the detection voltage. The control signal is given to the amplifier. The amplifier controls the current supplied to the gate of MOS transistor based on the control signal.

DETAILED DESCRIPTION OF THE PREFERRED EMBODIMENT

Figure 1:
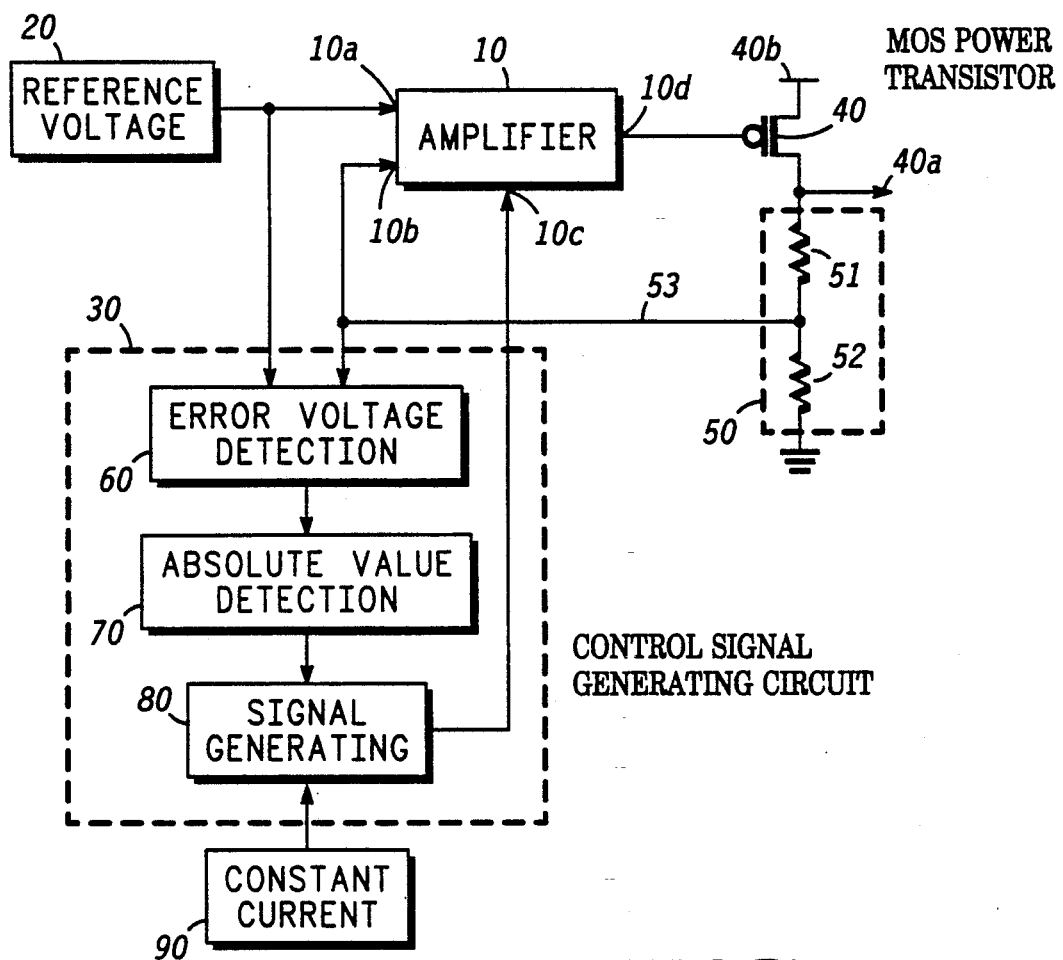
FIG. 1 shows a diagram of one embodiment of the invention.

FIG. 1 is a block diagram which shows one embodiment of this invention. Referring to FIG. 1, amplifier 10 has first input 10a, second input 10b, third input 10c and output 10d, wherein first input 10a is connected to an output of reference voltage source 20, second input 10b is connected to an output of detection circuit 50, and third input 10c is connected to an output of control signal generating circuit 30. An output of amplifier 10 is connected to the gate of MOS power transistor 40. Detection circuit 50 is provided between the drain of transistor 40 and the ground, in this embodiment, is formed by a circuit of resistor 51 and 52 in series. Output of detection circuit 50 is detected at the node of resistors 51 and 52, which is connected to second input 10b of amplifier 10 and control signal generating circuit 30.

In this embodiment, control signal generating circuit 30 is formed by error voltage detection circuit 60, absolute value detection circuit 70 and signal generating circuit 80. Although constant current source 90 is formed apart from control signal generating circuit 30, it may be formed in signal generating circuit 80.

Amplifier 10 compares the reference voltage supplied from reference voltage source 20 and the output voltage of detection circuit 50. For example, 1.5~2.0V is selected as the reference voltage. It is assumed that the output from the drain of MOS transistor 40 is held at a predetermined constant voltage and MOS transistor 40 keeps a steady-state. The detection voltage, which is derived from detection circuit 50 to signal line 53, is given to second input 10b, and compared with the reference voltage. Amplifier 10 applies the voltage in response to the voltage difference between them from output 10d to the gate of MOS transistor 40. MOS transistor 40 controls the current which flows between source and drain in response to the gate voltage, and provides a constant voltage from output 40a.

Figure 2:
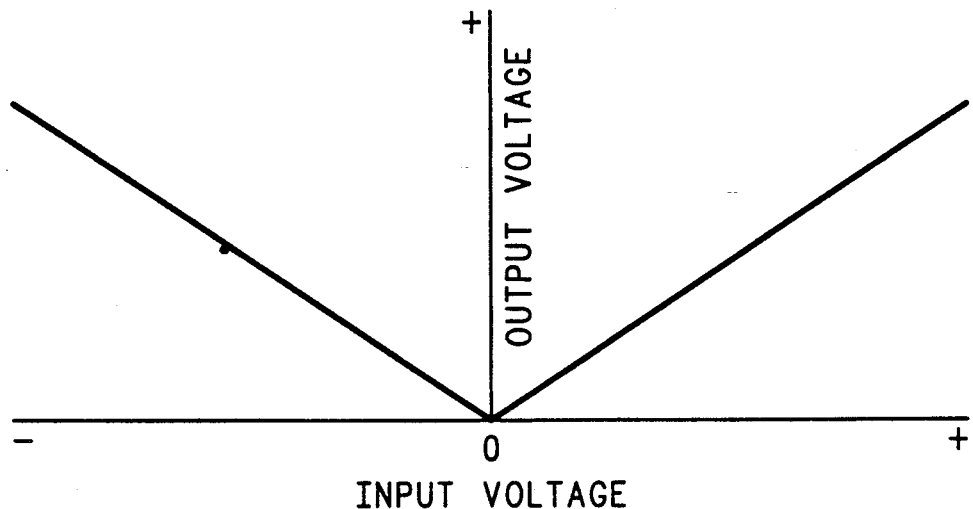
FIG. 2 shows a graph of input/output characteristic of a absolute value detection circuit.

It is assumed that the current which flows out from output 40a increases based on any reason. In this case, the output voltage from output 40a, that is, the drain voltage of MOS transistor 40 declines because the gate voltage of MOS transistor 40 keeps constant. Therefore the detection voltage detection circuit 50 decline the same as, the voltage is provided to second input 10b and error voltage detection circuit 60 through signal line 53. Amplifier 10 compares the reference voltage and the detection voltage, in this case, decreases the gate voltage and increases the current between the source and drain. Error voltage detection circuit 60 compares the reference voltage and the detection voltage and provides the difference voltage to absolute value detection circuit 70. Absolute value detection circuit 70 converts the voltage given by error voltage detection circuit 60 to an absolute value based on a predetermined voltage. FIG. 2 is a graph which explains a relationship between an input and output voltage when the predetermined voltage equals zero volt. The output voltage of absolute value detection circuit 70 is provided to signal generating circuit 80. The voltage value is multiplied by the constant current value supplied from constant current circuit 90, and the multiplied value is sent to amplifier 10. Amplifier 10 increases the gate current which controls MOS transistor 40, based on the current supplied from signal generating circuit 80, so that the operating speed of MOS transistor 40 increases.

Further, constant current circuit 90 may be included in amplifier 10 and the gate current may be changed in response to the signal provided by signal generating circuit 80, for example, voltage value, current value, etc.

Figure 3:
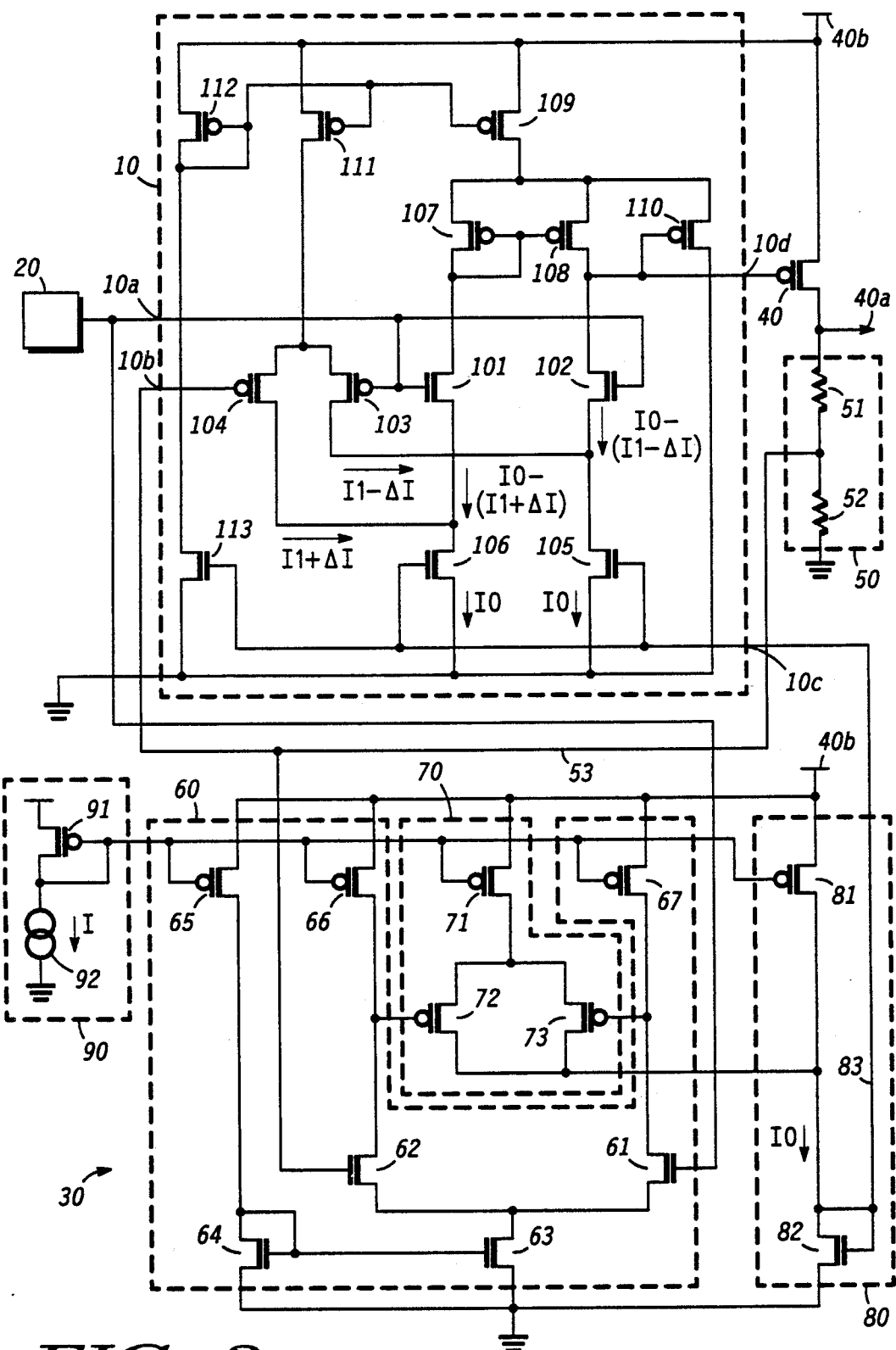
FIG. 3 shows a circuit of a bias current control circuit.

Next, FIG. 3 shows a circuit which specifically explains the constitution of FIG. 1. In FIG. 3, same reference number means same or similar portion.

The output of the reference voltage generating circuit 20 is connected to a gate of n-type MOS transistor 101 and 102, a gate of p-type MOS transistor 103 and a gate of n-type MOS transistor 61 in error voltage detection circuit 60. A source of p-type MOS power transistor 40 is connected to power line 40b and the drain is connected to output 40a. Detection circuit 50 formed by resistors 51 and 52 in series is connected between a drain of transistor 40 and the ground. The node of resistors 51 and 52 is connected to a gate of p-type MOS transistor 104 and a gate of n-type MOS transistor 62 in error detection circuit 60 through signal line 53 and input 10b. Sources of transistors 101 and 102 are respectively connected to drains of transistors 104 and 103, and connected to drains of n-type transistors 106 and 105. A drain of transistor 101 is connected to drain and gate of p-type MOS transistor 107, and connected to a gate of p-type MOS transistor 108. Sources of transistors 107 and 108 are connected to a drain of p-type MOS transistor 109 and a source of p-type MOS transistor 110 together, and further connected to power line 40b through a source of transistor 109. A drain of transistor 108 is connected to a drain of transistor 102 and a gate of transistor 110, and further a gate of power transistor 40 through output 10d of amplifier 10. Sources of transistors 103 and 104 are connected together, and connected to a drain of p-type MOS transistor 111. A gate of p-type MOS transistor 112 is connected to a drain thereof and gates of transistors 111 and 109. Further a drain of transistor 112 is connected to a drain of n-type MOS transistor 113. Sources of transistors 105, 106 and 113 and drain of transistor 110 are connected to the ground together.

Sources of transistors 61 and 62 are connected together and connected to a drain of n-type MOS transistor 63. A gate of transistor 63 is connected to a gate and drain of n-type MOS transistor 64, and further connected to a drain of p-type MOS transistor 65. A gate of transistor 65 is connected to a gate of p-type MOS transistor 91 in constant current source 90, and further connected to gates of transistors 66, 67, 71 and 81 together. Current source 92 is connected to transistor 91 in series, and transistor 91 and transistor 65, 66, 67, 71 and 81 forms a current mirror circuit respectively. Sources of transistors 65~67, 71 and 81 are respectively connected to power line 40b. Drains of transistors 66 and 67 are connected to drains of transistors 62 and 61, and connected to gates of p-type MOS transistors 72 and 73 in absolute value detection circuit 70 respectively. Sources of transistors 72 and 73 are connected to a drain of transistor 71 together, and connecting these drains together, connected to a drain of transistor 81 and a drain of n-type MOS transistor 82 in signal generating circuit 80. Sources of transistors 63, 64 and 82 are respectively connected to the ground. A gate of transistor 82 is connected to gates of transistors 105, 106 and 113 through control line 83 and input 10c.

The operation of the circuit shown in FIG. 3 is explained as follow. It is assumed that a load to MOS transistor 40 suddenly becomes heavy so that the detection voltage on the signal line 53 connected to detection circuit 50 drops. The detection voltage is applied to the gate of transistor 62 in error voltage detection circuit 60 and the gate of transistor 104 in amplifier 10. The reference voltage from reference voltage generating circuit 20 is applied to transistor 62 and the gate of transistor 61 which forms a differential amplifier and the differential voltage between the reference voltage and the detection voltage is applied to gates of transistors 72 and 73. Total current provided from sources of transistors 72 and 73 is proportional to the difference voltage between gates of transistors 72 and 73. Transistors 71 and 91 form a current mirror circuit, which determines maximum current that flows into transistors 72 and 73. The current provided from sources of transistors 72 and 73 flows into the drain of transistor 82 in control signal generating circuit 80. The current value in drain of transistor 82 is sent to amplifier 10 via control signal line 83, by which maximum current that flows into the gate of MOS transistor 40 is determined.

Transistor 82 and transistors 105, 106 and 113 form a current mirror circuit, the current in proportion to the drain current of transistor 82 flows into drains of transistors 105, 106 and 113 respectively.

The reference voltage and detection voltage are applied to gates of transistors 103 and 104 respectively, the current in proportion to the difference voltage between each gate voltage appears in the drain. The drain current of transistors 103 and 104 is added to the drain current of transistors 101 and 102. As already mentioned above, the drain current value of transistors 105 and 106 is determined by the drain current value of transistor 82 and it is almost same current value. Therefore the current difference in drains of transistors 103 and 104 appears as the current difference in drain current of transistors 101 and 102.

For example, as shown in FIG. 3, it is assumed that the drain current of transistor 82 equals to I0. The current I0 flows in drains of transistors 105 and 106 based on the Mirror effect. The drain current of transistor 103 shows an increase of $\Delta I$ and the drain current of transistor 104 shows a decrease of $\Delta I$ because the detection voltage is lower than the reference voltage. Therefore the current value which flows out from the source of transistor 101 equals to $I0-(I1+\Delta I)$, and the current value which flows out from the source of transistor 102 equals to $I0-(I1-\Delta I)$. That is, the drain voltage of transistor 102 drops because the drain current of transistor 102 shows an increase of $\Delta I$ in comparison with a balanced condition that the detection voltage is the same as the reference voltage. Since this drain voltage is applied to the gate of MOS transistor 40, the drain current equivalent to the drop of the gate voltage increases.

Further transistor 109 and 110 form a bootstrap circuit, which increases an output impedance and the gain of amplifier 10.

As mentioned above, according to the invention, even when the load of MOS transistor suddenly changes, the switching speed of MOS transistor does not slow down because the gate voltage of MOS transistor is controlled in response to the change of the gate voltage.

Further, the invention prevents from increasing power consumption in the circuit by which MOS power transistor is controlled.

I claim:

1. A bias current control circuit comprising:

a MOS transistor having a gate, a source and a drain;

a detection circuit in response to an output of said MOS transistor for providing a detection voltage;

a reference voltage source for generating a predetermined reference voltage;

an amplifier having a first input, a second input and a third input, said first input coupled to an output of said reference voltage source, said second input coupled to an output of said detection circuit and an output of said amplifier coupled to said gate of said MOS transistor, wherein said amplifier provides a voltage responsive to a difference voltage applied between said first input and said second input, and in response to a control signal given to said third input, said amplifier controls a current which flows into said gate; and a control signal generating circuit for supplying to said third input said control signal responsive to a difference between said reference voltage and a voltage provided at said output of said detection circuit;

said control signal being a current, said control signal generating circuit further including an error voltage detection circuit for providing an error voltage proportional to a difference between said reference voltage and a voltage provided at said output of said detection circuit;

an absolute value detection circuit for detecting an absolute value of said error voltage; and a signal generating circuit for providing a current proportional to output value of said absolute value detection circuit.

2. The bias current control circuit of claim 1, wherein said detection circuit comprises resistors connected in series.

* * * * *